United States Patent [19]

Shiraiwa

[11] Patent Number: 5,054,988

[45] Date of Patent: Oct. 8, 1991

[54] APPARATUS FOR TRANSFERRING SEMICONDUCTOR WAFERS

[75] Inventor: Hirotsugu Shiraiwa, Hino, Japan

[73] Assignee: Tel Sagami Limited, Kanagawa, Japan

[21] Appl. No.: 377,949

[22] Filed: Jul. 11, 1989

[30] Foreign Application Priority Data

Jul. 13, 1988 [JP] Japan .................. 63-174070

[51] Int. Cl.⁵ .................. B65G 65/04; H01L 21/60
[52] U.S. Cl. .................. 414/404; 98/115.3; 414/417; 414/744.8
[58] Field of Search ........... 414/403, 404, 416, 417, 414/744.8, 744.2, 222, 225; 98/115.3

[56] References Cited

U.S. PATENT DOCUMENTS

| | | |
|---|---|---|
| 4,568,234 | 2/1986 | Lee et al. |
| 4,573,851 | 3/1986 | Butler ............................ 414/404 |
| 4,597,819 | 7/1986 | Kusuhara et al. ............ 414/417 X |
| 4,890,780 | 2/1990 | Mimata et al. ............... 98/115.3 X |
| 4,904,153 | 2/1990 | Iwasawa et al. ............. 98/115.3 X |
| 4,923,352 | 5/1990 | Tamura et al. .............. 98/115.3 X |
| 4,947,784 | 8/1990 | Nishi ............................ 414/417 X |

FOREIGN PATENT DOCUMENTS 62-4142   1/1987   Japan ................... 414/417

Primary Examiner—Robert J. Spar
Assistant Examiner—Robert S. Katz
Attorney, Agent, or Firm—Oblon, Spivak, McClelland, Maier & Neustadt

[57] ABSTRACT

The present invention relates to an apparatus for transferring a plurality of semiconductor wafers from their cassettes to a boat. This apparatus comprises a support body on which the cassettes and the boat are mounted, a lifter for lifting wafers from the cassettes, a handling device for carrying the wafers and transferring them to the boat, and a plurality fans for introducing dust created by the handling device into the support body and removing it outside the support body.

9 Claims, 8 Drawing Sheets

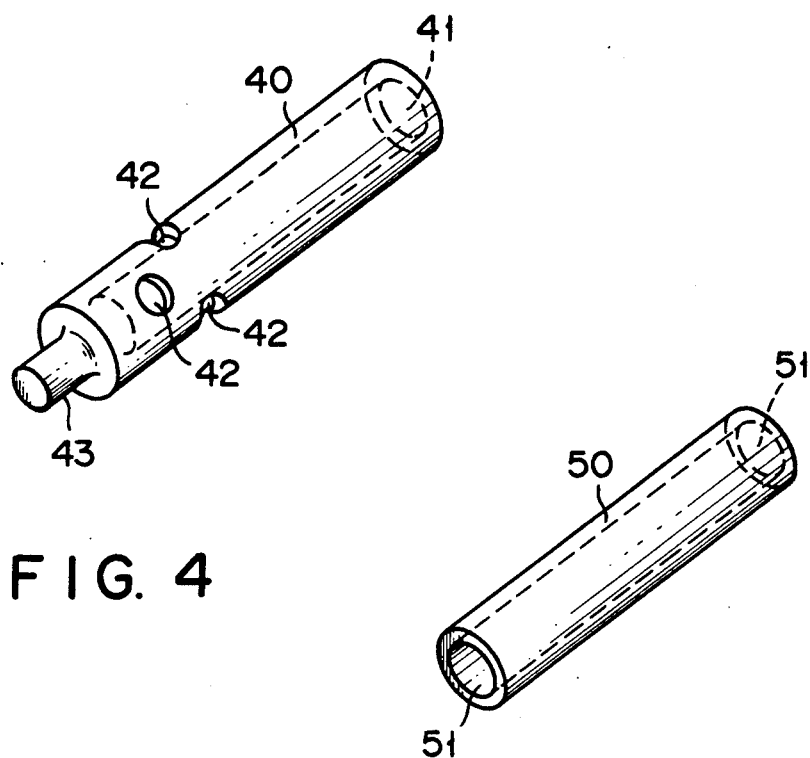
FIG. 4
FIG. 7
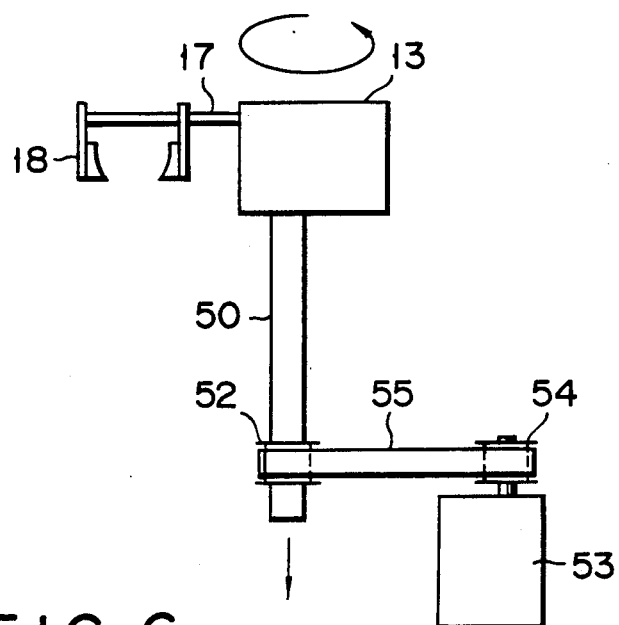
FIG. 6

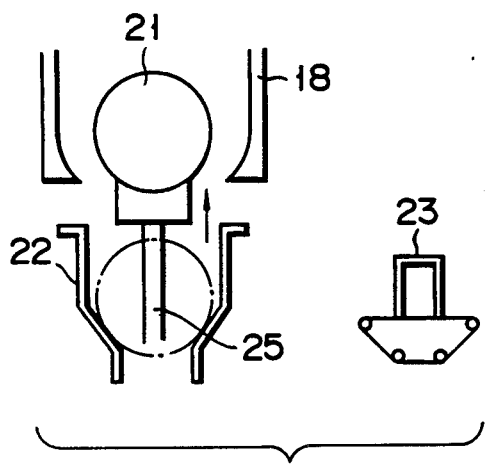
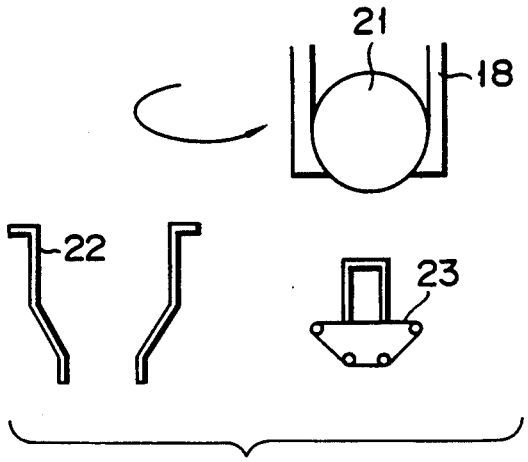
FIG. 5A    FIG. 5D
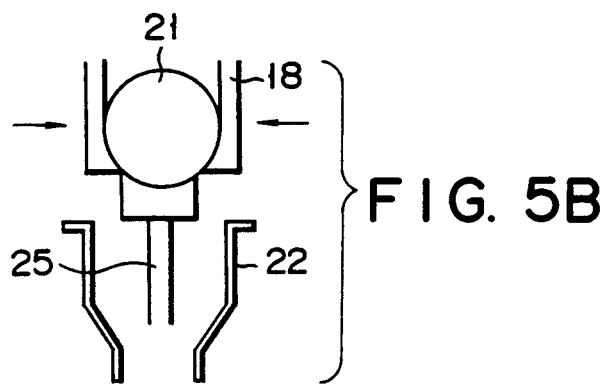
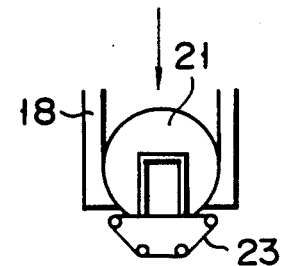
FIG. 5B    FIG. 5E
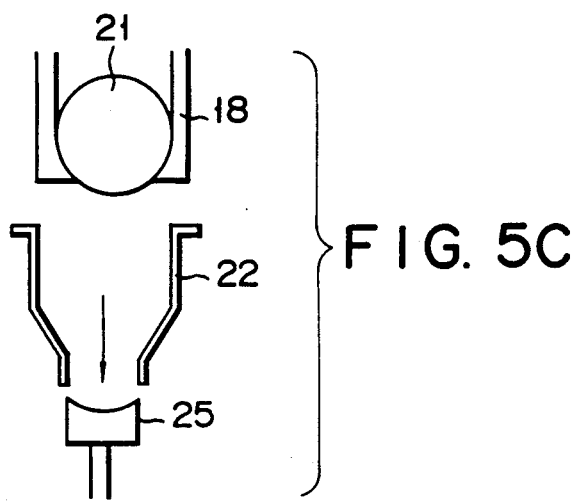
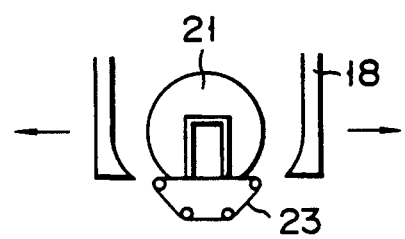
FIG. 5C    FIG. 5F

APPARATUS FOR TRANSFERRING SEMICONDUCTOR WAFERS

BACKGROUND OF THE INVENTION

1. Field of the Invention

The present invention relates to an apparatus for transferring semiconductor wafers from wafer-cassette to wafer-cassette or from wafer-cassette to a wafer-boat and, more particularly, it relates to an apparatus with a handling device capable of forcedly exhausting dust created by the handling device.

2. Description of the Related Art

As semiconductor devices (e.g. LSI) are more and more highly integrated, the measure of preventing dust from being created in a clean room has become important these days. For the purpose of keeping dust created in the clean room as little as possible, mechanisms of the apparatus and machines are covered by casings and made by those materials which can create dust as little as possible. In addition, clean air is fed from the ceiling of the clean room to the floor to keep the room highly clean by this down flow of clean air. Further, an exhaust means is provided on the bottom of the apparatus to forcedly exhaust dust created in the apparatus outside the room through the grating floor by the down flow of clean air.

A batch of semiconductor wafers are usually processed at various processes such as heat process and etching process in the course of manufacturing semiconductor devices. When wafers are to be carried from a place for a process to another place for a next process, they are stored in a cassette and carried together with the cassette. Various kinds of wafer carrying cassettes are used depending upon how the wafers are processed. Therefore, there arises a case where the cassette which was used for the previous process cannot be used at a next process. Further, when the wafers are to be subjected to heat diffusion process in the furnace, they must be transferred from the cassette to a quartz boat.

A wafer transferring apparatus is used exclusively to carry out this transferring of wafers. The apparatus includes lifter, handling and loader devices. When wafers are to be transferred by this apparatus, they are lifted above the cassette by the lifter device, held between members of the holder device, carried to a boat by the loader device and transferred onto the boat by opening chuck members. A plurality of wafer-inserting-grooves are formed on the boat at a certain space and the wafers are thus seated on the boat at this certain space. The wafer transferring operation is automatically computer-controlled according to a certain program.

The wafer transferring operation is repeated relative to plural cassettes on the cassette-table. In other words, a group of wafers are successively transferred from the plural cassettes to a boat.

In the case of the conventional apparatus shown in FIG. 1, a handling device includes a pair of chuck members 3. These chuck members 3 are attached to shafts 4, respectively, and these shafts 4 are connected to a driver system (not shown) in casing 5. Each of shafts 4 is supported by body 6 of casing 5 through non-seal type bearings 8.

In the case of the conventional apparatus, however, casing 5 in which the driving mechanism (or a combination of a motor, pulleys, a belt, bearings and the like) is housed is located adjacent to chuck members 3 and this makes it easy for dust caused by the driving mechanism to adhere to wafers 2. Namely, slight clearance 9 exists between shaft 4 and bearings 8. This structure allows dust in casing 5 to escape through these clearances 9 to stain wafers 2.

It is supposed that the bearings 8 of the seal type are used in this case to provide no clearance 9 between shaft 4 and bearings 8. When the bearings of the seal type are used, however, a large amount of dust is created by the bearings themselves. Therefore, it is a must that the handling device employs bearings 8 of the non-seal type which can keep the amount of dust created as little as possible.

Cover 7 of casing 5 is a thin plate of stainless steel to make the means as light as possible. Because cover 7 is thin, it is deformed by various causes and clearance is likely to be formed at its portion which is bonded to box 6. This allows dust in casing 5 for the handling device to escape outside and adhere to the wafers.

In the case of the conventional apparatus as described above, the wafers are stained with dust created by the holder means, thereby lowering the yield of the wafers.

SUMMARY OF THE INVENTION

The object of the present invention is to provide a wafer transfer device capable of preventing dust, which is caused by various kinds of means particularly wafer holding and pitch changing means, from adhering to wafers.

According to an aspect of the present invention, the apparatus for transferring semiconductor wafers comprises a support body on which first and second wafer seating members (cassettes and a boat) are mounted; a take-out means for taking wafers out of the cassettes; a handling means for carrying the lifted wafers and transferring them onto the boat; and a discharging means for introducing dust created by the handling means into the support body and discharging said dust from the support body.

According to an aspect of the present invention, another embodiment of the apparatus comprises a take-out means for taking wafers out of cassettes; a pitch changing means for holding the lifted wafers by its wafer holding system and changing the pitch interval between the wafers; a handling means for carrying the wafers and transferring them onto the boat; and a dust-removing means for introducing dust created by the pitch changing means and wafer holding system into the support body and removing them from the support body.

Wafers are taken out of the cassettes by the take-out means, held by the wafer holding system and the pitch interval between the wafers is changed by the pitch changing means if necessary. Dust created by the holding system and pitch changing means of the handling means at this time is introduced into the support body and then discharged from the support body by the dust-removing means. This stops dust from escaping toward the wafers through the handling means and thus prevents the wafers from being stained with dust.

The exhaust passage which extends from the handling means to the support body can be shaped in various manners. When a swing system is employed as the wafer carrying means, for example, a passage is formed through the shaft of this swing system and dust is introduced into the support body through this passage. The system and means of the handling means may be communicated with the support body through external ducts.

It is preferable that the dust-removing means is located most adjacent to the dust-creating source. It is therefore preferable that the dust-removing means is located in the wafer holding system or pitch changing means. The dust-removing means may be located in the carrying means, support body and coupling member, for example, in addition to the one located in the wafers holding system or pitch changing means. When the dust-removing means are located at all of them, exhaust effect can be further enhanced.

BRIEF DESCRIPTION OF THE DRAWINGS

FIG. 4 is a perspective view showing a swing shaft for the handling device of the first embodiment;

FIGS. 5A through 5F are intended to explain how wafers in cassettes are transferred onto a boat;

FIG. 6 is a schematic view showing another swing system which is a variation of the first embodiment;

FIG. 7 is a perspective view showing a swing shaft of the swing system shown in FIG. 6;

DETAILED DESCRIPTION OF THE PREFERRED EMBODIMENTS

Furnaces for heat processing (not shown) are arranged in a clean room and a soft landing device is located in front of the furnace of each stage. A wafer transferring device is arranged side by side with the soft landing device. The wafer transferring device extends along axis X of the furnace and it is connected to a computer system, by which its holder, lifter and loading means or systems are controlled.

Figure 1:
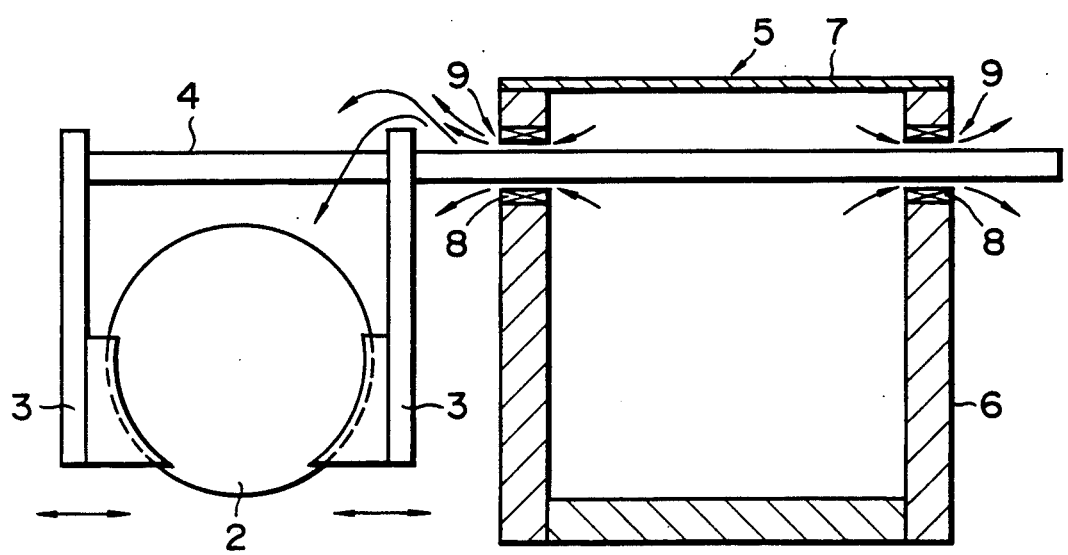
FIG. 1 is a sectional view schematically showing the handling device of the conventional apparatus.
Figure 2:
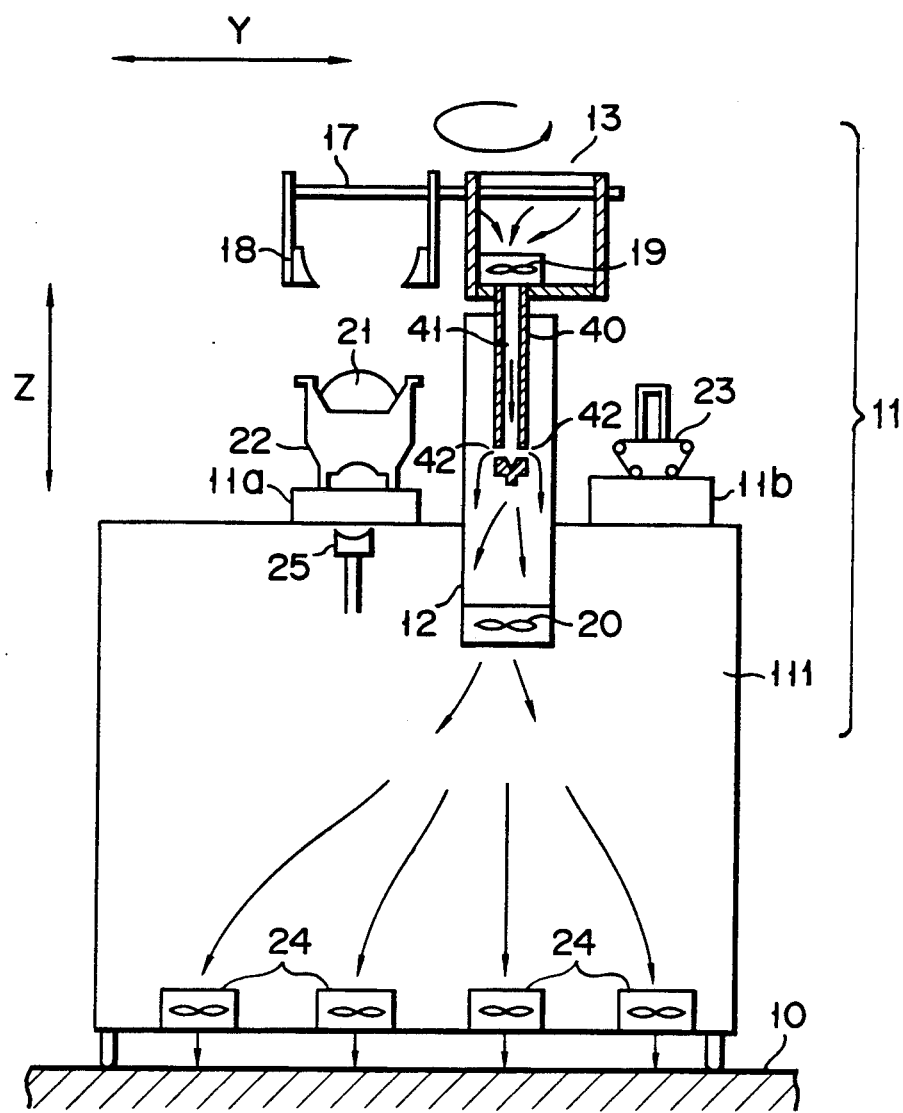
FIG. 2 is a sectional view schematicaliy showing a first embodiment of the apparatus according to the present invention, said apparatus being viewed in the longitudinal direction thereof.

As shown in FIG. 2, wafer transferring apparatus 11 stands on grating floor 10. Plural fans 24 are arranged on the bottom of apparatus 11. When fans 24 are rotated, a down draft of air is caused in apparatus 11 to forcedly discharge dust in apparatus 11 toward grating floor 10. Cassette stage 11a on which plural cassettes 22 are mounted and boat stage 11b on which boat 23 is mounted are arranged on the top of support body 111, extending along axis X, which extends perpendicular to the plane of the drawing sheet.

Cassette stage 11a is provided with an opening, just under which member 25 of the lifting system is waiting. Lifting member 25 is supported by a lifting mechanism (not shown) and moved back and forth along axis X. Wafer holding grooves are formed on the top of member 25 at a pitch interval of 3/16 inches.

Formed between stages 11a and 11b is an opening, which allows handling device 13 to move along axis X.

The lower end of coupling member 12 of handling device 13 is slidably connected to slide rails (not shown). Coupling member 12 is made hollow and provided with a fan 20 on the bottom thereof.

Figure 3:
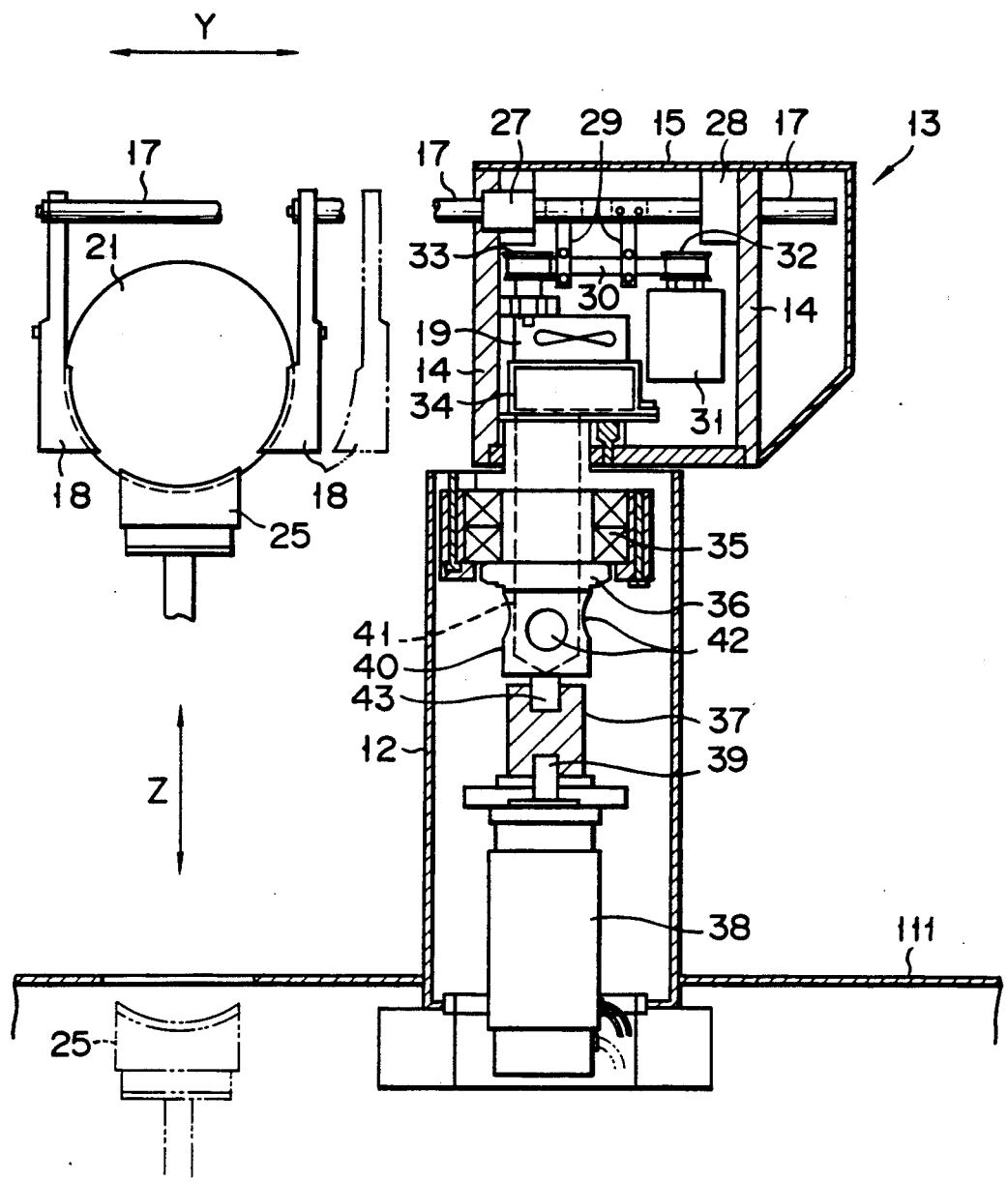
FIG. 3 is an enlarged sectional view showing a handling device of the first embodiment.

As shown in FIG. 3, the upper portion of handling device 13 is projected from the top of the support body 111. Chambers are formed on the top of coupling member 12 by means of casings 14 and 15. Casing 14 is made of a thick plate of stainless steel, while casing 15 is made of a thin plate of stainless steel. Casing 15 serves as a cover and it is fixed to casing 14 by screws.

Two pairs of shafts 17 made of stainless steel extend horizontally from casing 14. Chuck members 18 are attached to front ends of paired shafts 17. A pair of chuck members 18 are opposed to each other and located above cassette stage 11a. Wafer inserting grooves are formed on the inner face of each chuck member 18 at a pitch interval of 3/16 inches.

Paired shafts 17 are supported by casing 14 through bearings 27 and 28. Bearings 27 and 28 are of the non-seal type and made of stainless steel to reduce the amount of dust generated.

Shafts 17 are connected to the advancing side of belt 30 by a pair of arms 29, while other paired shafts 17 (not shown) to the retreating side of belt 30 by another pair of arms 29 (not shown). Belt 30 is stretched between pulleys 32 and 33. Pulley 32 is fitted onto the drive shaft of synchronous motor 31. When the drive shaft of motor 31 is rotated in the forward direction, a pair of chuck members 18 approach each other along axis Y (closing of the holder means), while when it is rotated in the backward direction, paired chuck members 18 separate from each other along axis Y (opening of the chuck member 18). Belt 30 is made of urethane resin and pulleys 32 and 33 of anodized aluminium alloy (or alumite).

Stepping motor 38 is located in coupling member 12. Drive shaft 39 of the motor is directed in the direction of axis Z and is connected to the lower end of Oldham coupling 37. The upper end of Oldham coupling 37 is connected to projection 43 which projects from the lower end of swing shaft 40. Swing shaft 40 extends in the direction of axis Z and reaches a wind box or plenum 34 in casing 14 at the upper end thereof. Fan 19 is mounted on the top of wind box 34.

Swing shaft 40 is supported by coupling member 12 through bearing 35, which is held tight by U-nut 36.

As shown in FIG. 4, passage 41 extends through swing shaft 40 from the top of shaft 40 to near the lower end thereof and it is communicates with the outside through plural holes 42.

Referring to FIGS. 5A through 5F, it will be described how wafers 21 in cassette 22 are transferred onto boat 23.

(I) Cassette 22 is mounted at a predetermined position on stage 11a. Boat 23 is mounted on stage 11b. Twenty-five wafers 21 are seated in cassette 22 at a pitch interval of 3/16 inches. Various kinds of data such as wafer sizes and pitch intervals are inputted into the computer system. Apparatus 11 is switched on to move handling device 13 in the direction of axis X and stop it at the position where chuck members 18 are just over cassette 22. As shown in FIG. 5A, lifting member 25 is moved upward to lift wafers 21 as a whole over cassette 22.

(II) As shown in FIG. 5B, chuck members 18 are closed to hold wafers 21 as a whole between them.

(III) As shown in FIG. 5C, lifting member 25 is moved downward.

(IV) Handling device 13 is swung about vertical axis Z. Wafers 21 are thus located just over boat 23, as shown in FIG. 5D.

(V) Handling device 13 is quietly lowered. Wafers 21 are thus seated in grooves on boat 23, as shown in FIG. 5E.

(VI) As shown in FIG. 5F, chuck members 18 are opened, separating from each other, to transfer wafers 21 to boat 23.

(VII) Handling device 13 is lifted and swung to position just above next cassette 22.

Above steps (I) through (VII) are repeated to transfer wafers 21 in next cassette 22 to a certain position on boat 23. When one hundred and fifty wafers 21 are transferred onto boat 23, the wafer transfer operation is finished. Boat 23 is fed into the furnace by means of the soft landing device and wafers 21 on boat 23 are subjected, as a whole, to a diffusion heat process.

Exhaust operation in apparatus 11 will be described referring to FIGS. 2 through 4.

When apparatus 11 is switched on, fans 19, 20 and 24 start rotating all at once. Down flow of air is generated in apparatus 11 by rotating air flow caused by plural fans 24 to thereby allow dust created in apparatus 11 to be sucked into grating floor 10. Dust generated in handling device 13 is passed through passage 41 and holes 42 of swing shaft 40 and fed into coupling member 12 by rotating air flow created by fan 19. It is then fed into apparatus 11 by rotating air flow created by fan 20 and discharged into grating floor 10 by rotating air flow created by bottom fans 24.

According to the first embodiment of the present invention, dust created in handling device 13 can be forcedly removed to effectively prevent wafers 21 from being stained with dust.

Further, it is bottom fans 24 that are used to discharge dust from the apparatus 11 to floor 10. Therefore, the apparatus can be made extremely simple in construction. This can prevent the apparatus from being large-sized and the manufacturing cost of the apparatus can be reduced.

Furthermore, exhaust holes 42 are formed passing through the side wall of hollow swing shaft 40 and this allows shaft 40 to be easily connected to the drive shaft of the motor. Coupling member 12 can be thus small-sized. When the capacity of each of fans 24 in the apparatus 11 is made large, fans 19 and 20 can be made unnecessary.

As apparent from a variation of the apparatus according to the present invention shown in FIGS. 6 and 7, the swing system can be modified. In the case of this variation, swing shaft 50 is made hollow and dust is passed through passage 51. Pulley 52 is fitted onto hollow swing shaft 50 and belt 55 is stretched between pulley 52 and another pulley 54 of motor 53.

According to this variation of the apparatus, wirings for electrically connecting supporting body of apparatus 11 to handling device 13 can be passed through passage 51 to thereby make the apparatus small in size.

Figure 8:
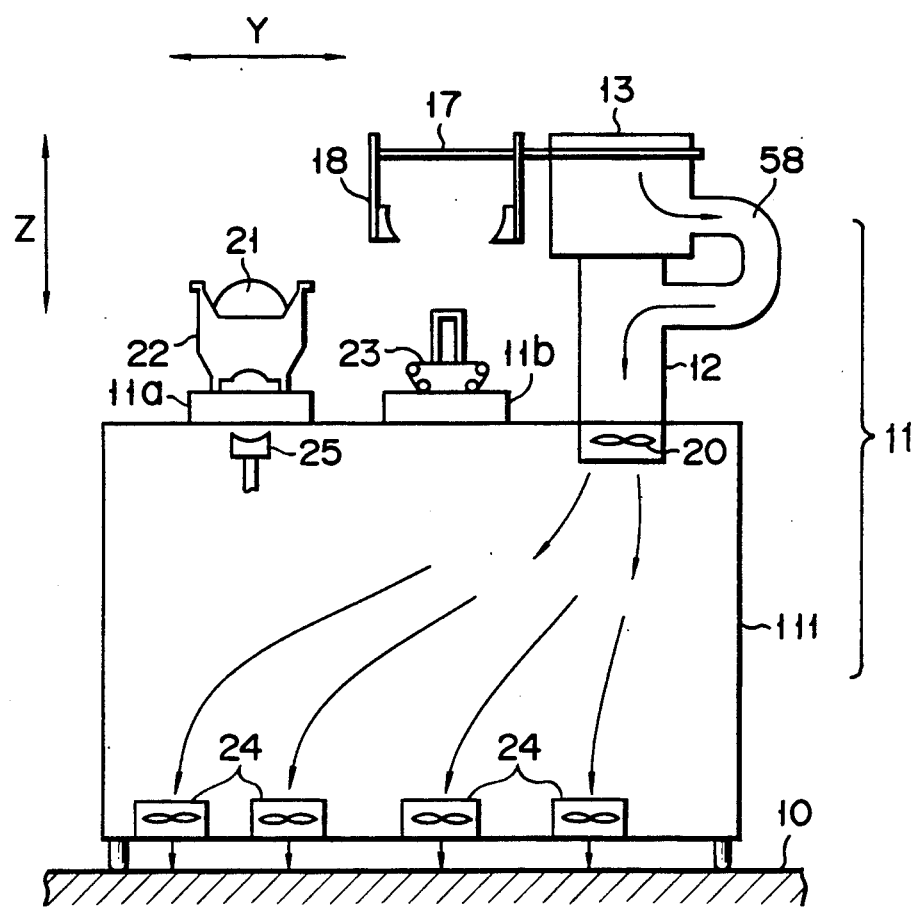
FIG. 8 is a schematic view showing another variation of the first embodiment which is provided with an external exhaust passage.

As apparent from another variation of the apparatus according to the present invention shown in FIG. 8, the exhaust passage can be modified. In the case of this variation, handling device 13 and coupling member 12 are communicated with each other through external exhaust duct 58.

According to this second variation, it is only exhaust duct 58 that is added to the supporting body of apparatus. Devices now in use, therefore, can be easily reconstructed. This is quite economical. In addition, the apparatus can be designed with larger freedom and when exhaust duct 58 is made large in diameter, the capacity of exhausting dust outside the apparatus can be enhanced.

Figure 9:
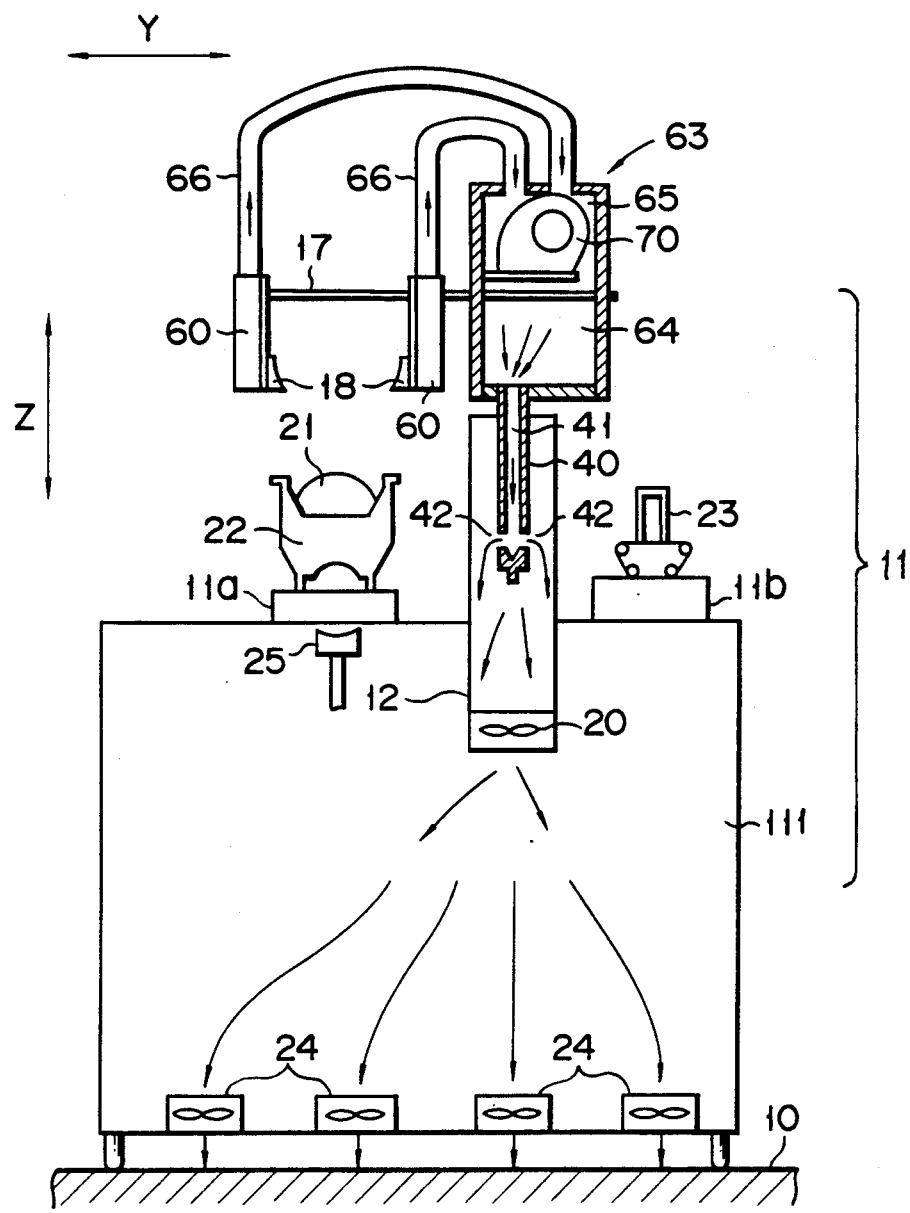
FIG. 9 is a sectional view schematically showing a second embodiment of the apparatus according to the present invention, said apparatus being viewed in the longitudinal direction thereof.
Figure 10:
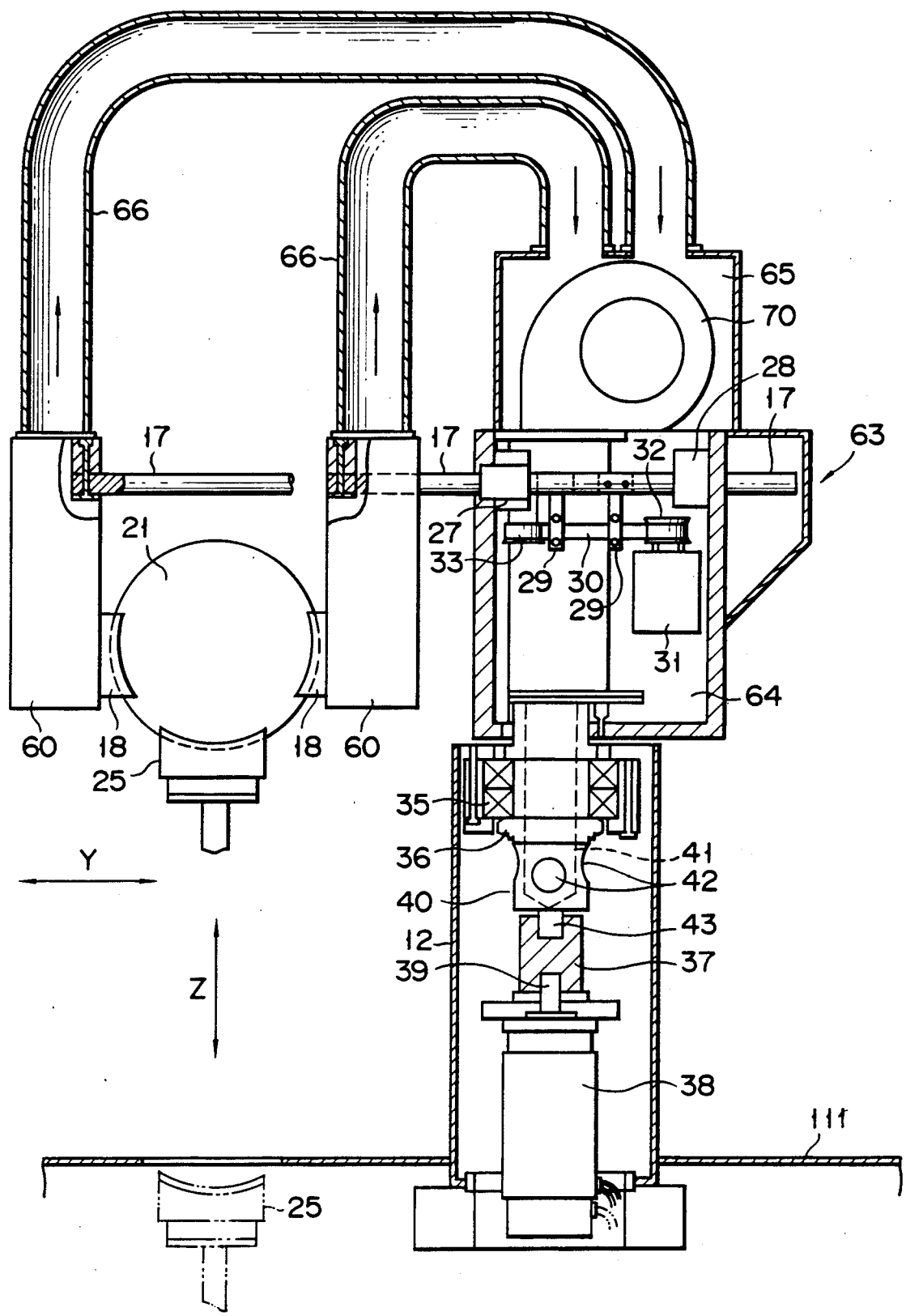
FIG. 10 is an enlarged sectional view showing a handling means of the second embodiment.

A second embodiment of the wafers transfer device according to the present invention will be described referring to FIGS. 9 and 10. Description on same parts as those in the first embodiment will be omitted.

Handling device 63 of the second embodiment includes means 60 for changing the pitch interval of wafers 21. Pitch changing device 60 is intended to change the first pitch interval of 3/16 inches to 6/16 inches and 9/16 inches, for example. When this means 60 is used, therefore, the pitch interval between wafers 21 can be changed to any desired one while wafers 21 being held between chuck members 18.

Casings of pitch changing means 60 and upper chamber 65 of holder means 63 are communicated through exhaust ducts 66. Small-sized blower 70 is arranged in upper chamber 65. The blow-off opening of blower 70 is directed toward lower chamber 64.

Swing shaft 40 extends from lower chamber 64 into coupling member 12 and passage 41 in swing shaft 40 is opened at lower chamber 64. Lower chamber 64 houses the driver means which comprises motor 31 and the like.

When wafers are being transferred by the second example of the wafers transfer device, blower 70 is kept operative and dust created by pitch changing means 60 is sucked into upper chamber 65. Air flow containing dust therein is fed from upper chamber 65 to lower chamber 64, then into coupling member 12 through passage 41 of swing shaft 40, and passed through device 11 to be exhausted through grating floor 10.

According to this second example, wafers 21 can be prevented from becoming stained with dust although the amount of dust created by pitch changing means 60 is relatively large. The yield of wafer products can be thus remarkably enhanced.

The apparatus can be prevented from becoming large in size because small-sized blower 70 having excellent suction capacity is used in the second embodiment.

Furthermore, the apparatus of the present invention apply to both vertical type and horizontal type furnace.

According to the wafers transfer device of the present invention as described above, dust created by the holder means can be forcedly exhausted outside the clean room. Therefore, wafers can be effectively prevented from becoming stained with dust.

What is claimed is:

1. An apparatus for transferring semiconductor wafers comprising:
   a hollow support body;
   first and second wafer seating members mounted on said hollow support body;
   a take-out means for lifting wafers out of the first wafer seating member;
   a handling means for transferring wafers from the take-out means to the second wafer seating member, said handling means including a swing means of swinging the wafers about a first vertical axis;
   dust-removing means for introducing dust created by the handling means into the hollow support body and for removing said dust from the hollow support body;
   a swing shaft included in said swing means and a passage formed in said swing shaft, said passage joining the handling means with the hollow support body in fluidic communication; and an exhaust hole formed in a lower portion of the swing shaft allowing fluid to pass from the handling means to the hollow support body.

2. The apparatus according to claim 1, wherein said dust removing means is contained at least partly within said handling means.

3. The apparatus according to claim 1, wherein the dust-removing means is contained at least partly within the support body.

4. The apparatus according to claim 1, wherein said handling means and said support body are joined by a coupling member and the dust-removing means is at least partly contained within the coupling member.

5. The apparatus according to claim 1, wherein said exhaust hole is formed in a side wall of the swing shaft.

6. The apparatus according to claim 1, wherein said exhaust hole is formed at a lower end of the swing shaft.

7. The apparatus according to claim 1, wherein said handling means includes a plurality of chuck member adapted to grip wafers therebetween, and wherein said dust-removing means includes means for removing dust from the vicinity of said chuck members.

8. The apparatus according to claim 7, wherein said means for removing dust form the vicinity of said chuck members includes exhaust ducts.

9. The apparatus according to claim 8, wherein said means for removing dust form the vicinity of said chuck members further includes a small-sized blower adapted to produce an air flow through said exhaust ducts toward said hollow support body.

* * * * *